United States Patent
Tammone, Jr.

(10) Patent No.: US 6,229,374 B1
(45) Date of Patent: May 8, 2001

(54) VARIABLE GAIN AMPLIFIERS AND METHODS HAVING A LOGARITHMIC GAIN CONTROL FUNCTION

(75) Inventor: John M. Tammone, Jr., Vista, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/534,644

(22) Filed: Mar. 23, 2000

(51) Int. Cl.[7] .................................................. H03G 11/08
(52) U.S. Cl. ........................................ 327/350; 327/359
(58) Field of Search ..................................... 327/350, 351, 327/352, 355, 359, 560–563; 330/254

(56) References Cited

U.S. PATENT DOCUMENTS

| | | | |
|---|---|---|---|
| 5,352,944 | * 10/1994 | Sacchi et al. | 327/350 |
| 5,448,772 | 9/1995 | Grandfield | 327/357 |
| 5,563,545 | 10/1996 | Scheinberg | 327/389 |
| 5,563,550 | 10/1996 | Toth | 329/347 |
| 5,570,055 | * 10/1996 | Gilbert | 327/350 |
| 5,587,687 | 12/1996 | Adams | 327/359 |
| 5,625,307 | 4/1997 | Scheinberg | 327/113 |
| 5,649,288 | 7/1997 | De Loe, Jr. et al. | 455/33.1 |
| 5,734,299 | 3/1998 | Brown | 330/254 |
| 5,734,703 | 3/1998 | Hiyoshi | 379/98 |
| 5,764,559 | 6/1998 | Kimura | 327/359 |
| 5,818,279 | * 10/1998 | Dick | 327/350 |
| 5,880,631 | 3/1999 | Sahota | 330/51 |
| 5,952,880 | * 9/1999 | Voorman et al. | 327/359 |

* cited by examiner

Primary Examiner—Toan Tran
(74) Attorney, Agent, or Firm—Blakely, Sokoloff, Taylor & Zafman LLP

(57) ABSTRACT

Variable gain amplifiers and methods having a logarithmic gain control function are disclosed. The variable gain amplifiers have a first inverse hyperbolic tangent stage having a current input responsive to a gain control signal, a second inverse hyperbolic tangent stage responsive to the output of the first hyperbolic tangent stage, and a Gilbert cell providing an amplifier output responsive to an amplifier input with a gain responsive to the output of the second inverse hyperbolic stage. The inverse hyperbolic gain response is altered to closely approximate the desired logarithmic characteristic by including a circuit responsive to the gain control signal to provide a current input to the first inverse hyperbolic stage which is nonlinear with respect to the gain control signal.

7 Claims, 1 Drawing Sheet

VARIABLE GAIN AMPLIFIERS AND METHODS HAVING A LOGARITHMIC GAIN CONTROL FUNCTION

BACKGROUND OF THE INVENTION

1. Field of the Invention

The present invention relates to the field of variable gain amplifiers.

2. Prior Art

Amplifiers having a gain control capability are commonly used in wireless cell phone and other analog circuit applications. In the cell phone case, a signal is received on an antenna, with the strength of the received signal varying to a very large degree as the cell phone moves with respect to the base station (transmitted signal). A simple fixed gain receiver would amplify the variation to provide a widely varying signal to the analog-to-digital conversion circuitry within the cell phone that converts the signal to a digital signal for further processing. Such a wide variation in signal strength would result in an unacceptable error when converted to digital form by the analog-to-digital converter circuitry.

To avoid these problems, a variable gain amplifier is used to adjust the gain in the path of the received signal so that the full available range of the analog-to-digital converter circuitry may be used. In such applications, it is desired to provide a variable gain receive path amplification that produces a logarithmic characteristic in the gain path with a gain control signal such that the decibels of gain is linearly related to the gain control signal VAGC controlling the amplifier stage(s).

BRIEF SUMMARY OF THE INVENTION

Variable gain amplifiers and methods having a logarithmic gain control function are disclosed. The variable gain amplifiers have a first inverse hyperbolic tangent stage having a current input responsive to a gain control signal, a second inverse hyperbolic tangent stage responsive to the output of the first hyperbolic tangent stage, and a Gilbert cell providing an amplifier output responsive to an amplifier input with a gain responsive to the output of the second inverse hyperbolic stage. The inverse hyperbolic gain response is altered to closely approximate the desired logarithmic characteristic by including a circuit responsive to the gain control signal to provide a current input to the first inverse hyperbolic stage which is nonlinear with respect to the gain control signal.

DETAILED DESCRIPTION OF THE PREFERRED EMBODIMENT

Figure 1:
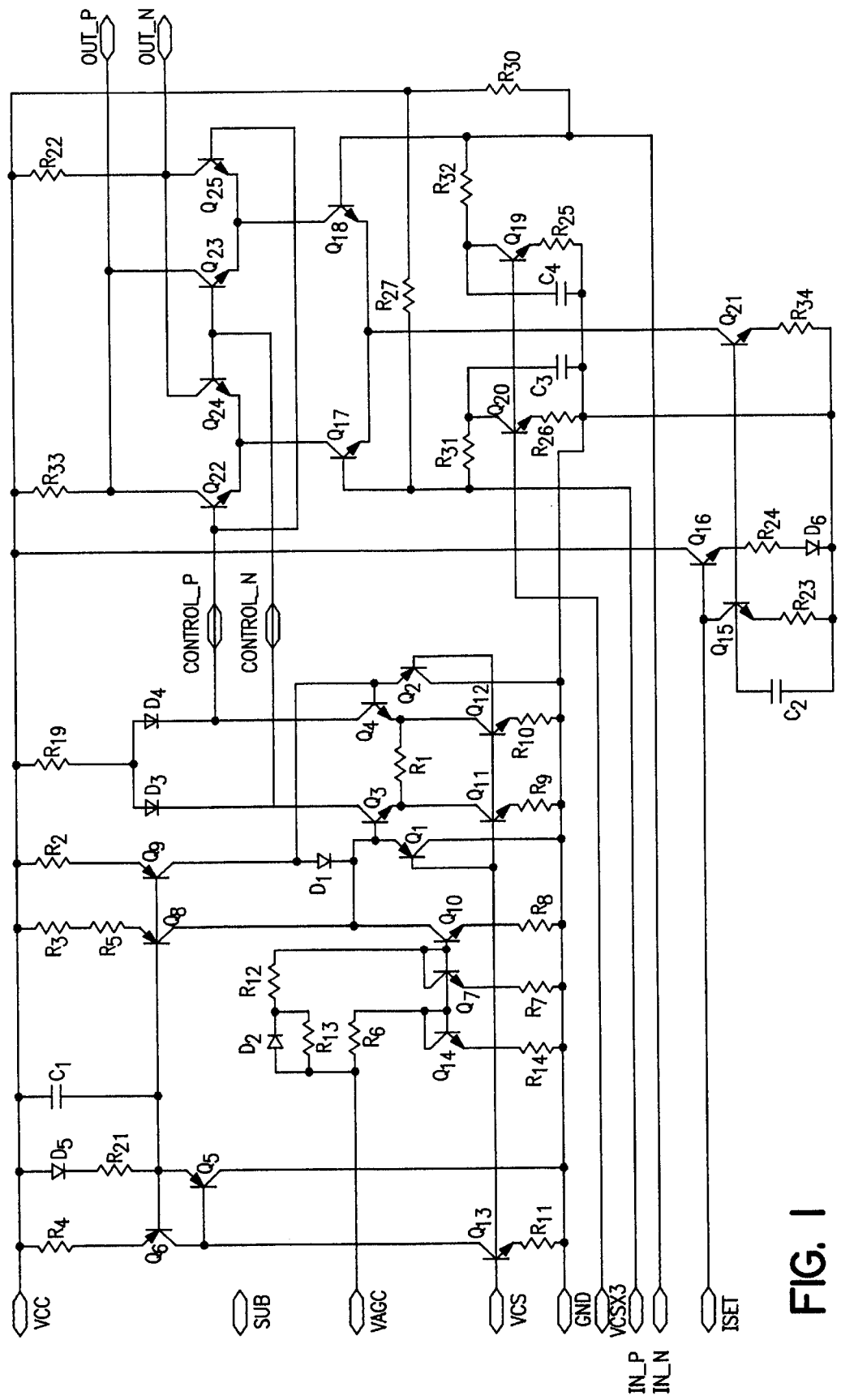
FIG. 1 is a circuit diagram of a preferred embodiment of the present invention.

Referring to FIG. 1, a circuit diagram for an embodiment of the present invention may be seen. The circuit shown has a portion identified as the linearizer and a second portion identified as the gain control, with the amplifier itself providing a differential output OUT_P, OUT_N, responsive to a differential input IN_P, IN_N and the gain control signal VAGC. The embodiment shown is suitable for amplification of RF signals, though may be used for amplification of other signals as desired.

In the circuit shown, the voltage VCS is derived in a conventional manner to establish a constant current through transistor $Q_{13}$ and resistor $R_{11}$, as well as through transistor $Q_{11}$ and resistor $R_9$, and transistor $Q_{12}$ and resistor $R_{10}$. The current through transistor $Q_{13}$ and resistor $R_{11}$ is mirrored by transistor $Q_6$ and resistor $R_4$ to transistor $Q_9$ and resistor $R_2$. Resistor $R_3$ has the same resistance as resistors $R_2$ and $R_4$, though resistor $R_5$, having a relatively low resistance, results in a current flow through resistors $R_3$ and $R_5$ and transistor $Q_8$, which is somewhat less than the current mirrored to transistor $Q_9$. Transistor $Q_5$, resistor $R_{21}$ and diode $D_5$ act as a beta helper for transistors $Q_6$, $Q_8$ and $Q_9$ to provide the base currents thereto. In addition, diode $D_5$ acts as a clamp, assuring turn off of transistors $Q_8$ and $Q_9$ when the voltage VCS goes to zero volts.

Similarly, the voltage VCSX3 is derived to produce a constant current in transistor $Q_{20}$ and resistor $R_{26}$, and transistor $Q_{19}$ and resistor $R_{25}$. Also, an input current ISET through transistor $Q_{15}$ and resistor $R_{23}$ is mirrored to transistor $Q_{21}$ and resistor $R_{34}$, thereby establishing the tail current for transistors $Q_{17}$ and $Q_{18}$. Transistor $Q_{16}$, resistor $R_{24}$ and diode $D_6$ act as a beta helper for transistor $Q_{21}$ to provide the base currents thereto. Also, diode $D_6$ acts as a clamp, assuring transistor $Q_{21}$ shuts off when ISET is at zero current.

In the circuit of FIG. 1, capacitors $C_1$ and $C_2$ are for noise reduction purposes. Capacitors $C_3$ and $C_4$ are for suppressing the RF signal across the current sources of transistor $Q_{20}$ and resistor $R_{26}$, and transistor $Q_{19}$ and resistor $R_{25}$.

In operation, the gain control voltage VAGC will range from approximately one VBE above ground to approximately 2.5 volts. At the low end of the range, transistors $Q_{14}$ and $Q_7$ will not significantly conduct, and accordingly, transistor $Q_{10}$ will also be substantially off. Consequently, the current through transistor $Q_8$ will all pass through transistor $Q_1$, establishing the voltage on the base of transistor $Q_3$ at one VBE above the voltage VCS. Similarly, the current through transistor $Q_9$ will pass through transistor $Q_2$, establishing the voltage on the base of transistor $Q_4$ at one VBE above the voltage VCS. (Diode $D_1$ is not sufficiently forward biased during normal operation to be conducting.) However, because the current through transistor $Q_8$ is slightly less than the current through transistor $Q_9$, the VBE of transistor $Q_1$ will be slightly less than that of transistor $Q_2$, so that transistor $Q_4$ will be slightly more conducting than transistor $Q_3$. The small differential voltage on the bases of transistors $Q_3$ and $Q_4$ results in a corresponding differential voltage on the emitters of transistors $Q_3$ and $Q_4$, providing a current in proportion thereto through resistor $R_1$. Since the collector currents in transistors $Q_{11}$ and $Q_{12}$ are equal, the current through resistor $R_1$ must be provided by a differential current through diodes $D_3$ and $D_4$, diode $D_4$ conducting an amount of current greater than diode $D_3$ equal to twice the current through resistor $R_1$. Consequently, the differential output of the linearizer will be slightly biased by the presence of resistor $R_4$ so that a minimum value of the differential control CONTROL_P, CONTROL_N is provided to the amplifier. The common mode voltage of the differential control CONTROL_P, CONTROL_N is set by resistor $R_{19}$ and diodes $D_3$ and $D_4$, the current there through being equal to the sum of the current of current sources $Q_{11}$ and $R_9$, and $Q_{12}$ and $R_{10}$, and thus independent of the gain control voltage VAGC. Also, diodes $D_3$ and $D_4$ could be realized as diode connected transistors, both diodes and diode connected transistors being included within the meaning of the word diode as used herein and in the claims to follow.

As the gain control voltage VAGC is increased, commanding greater gain of the amplifier, transistor $Q_{14}$ will begin to turn on, with the current through transistor $Q_{14}$ being mirrored to transistor $Q_{10}$ and resistor $R_9$. If resistor $R_{13}$, an optional resistor, is present, there will also be a component of current through resistors $R_{13}$ and $R_{12}$ and transistors $Q_{14}$ and $Q_7$. As the gain control voltage VAGC continues to increase, the voltage drop across resistor $R_{13}$, if present, will reach the forward conduction diode voltage drop of diode $D_2$. If resistor $R_{13}$ is not present, the voltage drop across resistor $R_6$ will reach the forward conduction voltage drop of diode $D_2$, in either case providing a more steeply increasing current through resistor $R_{12}$ with further increasing gain control voltage VAGC. Accordingly, for the minimum value of voltage VAGC, the current through transistor $Q_{10}$ will be substantially zero. With initially increasing values of VAGC, there will be an approximately proportional increase in current through transistor $Q_{10}$, and with increasing values of VAGC in the upper portion of the VAGC range, the current through transistor $Q_{10}$ will increase at a greater rate because of the conduction through diode $D_2$ also contributing to the current flow through transistors $Q_{14}$ and $Q_7$.

The current through transistor $Q_{10}$ diminishes the current through transistor $Q_1$, by providing an alternate path for the current through transistor $Q_8$, thereby further raising the voltage on the base of transistor $Q_4$, thereby lowering the voltage on the emitter of transistor $Q_3$ with respect to the emitter of transistor $Q_4$, increasing the current flow through resistor $R_1$ to further increase the current flow through diode $D_4$ and further decrease the current flow through diode $D_3$, increasing the differential voltage CONTROL_P, CONTROL_N on the output of the linearizer.

The differential input IN_P, IN_N is applied to the bases of transistors $Q_{17}$ and $Q_{18}$. The common mode voltage for the differential input, as well as the input impedance thereof, is set by currents through resistors $R_{30}$ and $R_{27}$ and resistors $R_{32}$ and $R_{31}$ by current sources $Q_{20}$ and $R_{26}$ and $Q_{19}$ and $R_{25}$, respectively. The differential input IN_P, IN_N determines the division of the tail current through transistors $Q_{21}$ and $R_{34}$ between transistors $Q_{17}$ and $Q_{18}$. When the differential input is zero, the tail current will divide equally between transistors $Q_{17}$ and $Q_{18}$. For a positive differential input, transistor $Q_{17}$ will conduct a larger portion of the tail current and transistor $Q_{28}$ a smaller portion of the tail current, and for a negative differential input, transistor $Q_{17}$ will conduct a smaller portion of the tail current and transistor $Q_{28}$ a larger portion of the tail current. Assuming for the moment that the gain control voltage VAGC is at its lower limit, the voltage on CONTROL_P will be slightly higher than the voltage on CONTROL_N. Thus, transistors $Q_{24}$ and $Q_{23}$ will be conducting slightly more than transistors $Q_{22}$ and $Q_{25}$. However, transistors $Q_{22}$ through $Q_{25}$ are all the same size. Consequently, since the current through resistor $R_{33}$ is equal to the sum of the currents through transistors $Q_{22}$ and $Q_{23}$, and the current through resistor $R_{22}$ is equal to the sum of the currents through transistors $Q_{24}$ and $Q_{25}$, the currents through resistors $R_{22}$ and $R_{33}$ will be equal, so that the differential output OUT_P, OUT_N will be zero.

With a positive differential signal input IN_P, IN_N, a larger fraction of the tail current through transistors $Q_{21}$ and $R_{34}$ will flow through transistor $Q_{17}$ and less through transistor $Q_{18}$. The division of current between transistors $Q_{23}$ and $Q_{25}$ will be the same as the division of current between transistors $Q_{24}$ and $Q_{22}$. However the larger current through transistor $Q_{17}$ under these conditions, will cause a larger increase in the current in transistor $Q_{24}$ than in transistor $Q_{23}$ and a larger decrease in current through transistor $Q_{22}$ than in transistor $Q_{25}$. Consequently, the increase in current through transistor $Q_{24}$ will more than offset the decrease in current through transistor $Q_{25}$, increasing the current through resistor $R_{22}$ to reduce the voltage on the output terminal OUT_N. Similarly, the decrease in current through transistor $Q_{22}$ will be more than the increase in current through transistor $Q_{23}$, thereby decreasing the total current through resistor $R_{33}$ to increase the output on output terminal OUT_P. For higher differential inputs IN_P, IN_N, more of the tail current for transistors $Q_{17}$ and $Q_{18}$ will be steered through transistor $Q_{17}$ and less through transistor $Q_{18}$, increasing the differential output OUT_P, OUT_N accordingly.

For higher values of the gain control voltage VAGC, the differential voltage CONTROL_P, CONTROL_N will increase, as previously described. This steers a greater fraction of the current through transistor $Q_{17}$ through transistor $Q_{24}$ and less through transistor $Q_{22}$, and a greater fraction of the current through transistor $Q_{17}$ through transistor $Q_{23}$ and less through transistor $Q_{25}$, having the net effect of increasing the gain of the amplifier.

Having now described the detailed operation of the circuit of FIG. 1, the general characteristics thereof will now be apparent. Transistors $Q_{22}$, $Q_{24}$, $Q_{23}$, $Q_{25}$, $Q_{17}$, $Q_{18}$, $Q_{20}$, $Q_{19}$, $Q_{15}$, $Q_{16}$ and $Q_{21}$ and the other circuit elements associated with those transistors form a Gilbert cell having a characteristic hyperbolic tangent function non-linearity. However, transistors $Q_1$, and $Q_2$ provide an inverse hyperbolic tangent stage and diodes $D_3$ and $D_4$ provide another inverse hyperbolic tangent stage, leaving a net single inverse hyperbolic tangent function for gain versus the AGC signal VAGC. This net inverse hyperbolic tangent function coarsely approaches the desired logarithmic gain control function, which is forced to closely approach the desired logarithmic gain control function by the shaping effect of diode $D_2$ and resistor $R_{12}$ and the circuitry associated therewith (and resistor $R_{13}$, if the same is included). Finally, of course, the gain control circuit is biased to operate in a single quadrant by resistor $R_5$ and the circuitry associated therewith, resistor $R_5$ assuring that the current through transistor $Q_1$ is less than the current through transistor $Q_2$, even with transistor $Q_{10}$ turned off.

In the embodiment shown, if the gain control voltage VAGC was applied to the circuit so as to provide a differential voltage on the bases of transistors $Q_3$ and $Q_4$ proportional to the gain control voltage, the current through resistor $R_1$ and the direction thereof would be linearly dependent on the gain control voltage VAGC. That current would provide a differential voltage drop across diodes $D_3$ and $D_4$ having the characteristic of an inverse hyperbolic function, so that that differential voltage drop applied to the bases of transistors $Q_{24}$ and $Q_{22}$, and transistors $Q_{23}$ and $Q_{25}$, would result in a division of current between each of those transistor pairs, linearly proportional to the gain control voltage. However, the differential voltage on the bases of transistors $Q_3$ and $Q_4$ is not linearly proportional to the gain control voltage VAGC, but rather, neglecting diode $D_2$ for the moment, is dependent upon the differential base emitter voltages of transistors $Q_1$ and $Q_2$ having a current which is approximately proportional to the gain control voltage, thereby providing a further inverse hyperbolic tangent function on the gain in response to the automatic gain control voltage VAGC. Diode $D_2$ and the circuitry associated therewith makes the differential current in transistors $Q_1$ and $Q_2$ non-linearly related to the gain control voltage VAGC in a manner to alter the gain control characteristics to achieve more precise matching of the desired logarithmic gain control characteristic. Thus, the circuit includes a first inverse hyperbolic stage having a current input responsive to a gain control signal, a second inverse hyperbolic stage responsive to the output of the first hyperbolic stage, and a Gilbert cell providing an amplifier output responsive to an amplifier input, with a gain responsive to the output of the second inverse hyperbolic stage. The matching of the gain control with the desired logarithmic gain control function is improved by providing a current input to the first inverse hyperbolic stage which is non-linear with respect to the gain control signal.

While a specific embodiment of the present invention has been disclosed and described herein, it will be understood by those skilled in the art that various changes in form and detail may be made therein without departing from the spirit and scope of the invention.

What is claimed is:

1. A variable gain amplifier comprising:

a first inverse hyperbolic stage having a current input responsive to a gain control signal;

a second inverse hyperbolic stage responsive to the output of the first hyperbolic stage; and, a Gilbert cell providing an amplifier output responsive to an amplifier input with a gain responsive to the output of the second inverse hyperbolic stage.

2. The variable gain amplifier of claim 1 further comprised of a circuit responsive to the gain control signal to provide a current input to the first inverse hyperbolic stage which is nonlinear with respect to the gain control signal.

3. A variable gain amplifier comprising:

first, second, third and fourth transistors, each having an emitter, a base and a collector;

the first and second transistors having their bases coupled together;

a first circuit providing a differential current through the first and second transistors responsive to an automatic gain control signal;

first and second current sources coupled to the emitters of the third and fourth transistors, respectively, and a first resistor coupled between the emitters of the third and fourth transistors;

the emitters of the first and second transistors being coupled to the bases of the third and fourth transistors, respectively;

the collectors of the third and fourth transistors being coupled to first and second diodes and to the control of a Gilbert cell.

4. The variable gain amplifier of claim 3 wherein the first circuit provides a differential current through the first and second transistors which is nonlinearly responsive to the automatic gain control signal.

5. The variable gain amplifier of claim 4 wherein the first circuit provides a differential current through the first and second transistors which is biased to have the same polarity throughout the operating range of the automatic gain control signal.

6. The variable gain amplifier of claim 5 wherein the first circuit comprises first and second current sources providing first and second currents to the first and second transistors, respectively, the first current source providing a smaller current than the second current source, the first circuit diverting part of the current of the first current source from the first transistor responsive to the automatic gain control signal.

7. The variable gain amplifier of claim 5 wherein the Gilbert cell has a differential input and a differential output.

* * * * *